United States Patent
Flax et al.

(10) Patent No.: US 10,914,778 B2
(45) Date of Patent: Feb. 9, 2021

(54) TRANSFORMER TESTING DEVICE, AND METHOD FOR TESTING A TRANSFORMER

(71) Applicant: OMICRON ELECTRONICS GMBH, Klaus (AT)

(72) Inventors: Dirk Flax, Dornbirn (AT); Markus Pütter, Sulz (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 0 days.

(21) Appl. No.: 15/543,063

(22) PCT Filed: Dec. 18, 2015

(86) PCT No.: PCT/EP2015/080496
§ 371 (c)(1),
(2) Date: Jul. 12, 2017

(87) PCT Pub. No.: WO2016/113072
PCT Pub. Date: Jun. 21, 2016

(65) Prior Publication Data
US 2018/0003760 A1    Jan. 4, 2018

(30) Foreign Application Priority Data

Jan. 13, 2015 (AT) .............................. A 50022/2015

(51) Int. Cl.
*G01R 31/02* (2006.01)
*H02P 13/00* (2006.01)

(52) U.S. Cl.
CPC ............ *G01R 31/027* (2013.01); *H02P 13/00* (2013.01)

(58) Field of Classification Search
CPC .................................................... G01R 31/027
See application file for complete search history.

(56) References Cited

U.S. PATENT DOCUMENTS

| 5,276,402 A | 1/1994 | Schucht |
| 7,026,822 B1 | 4/2006 | Bald et al. |
| 7,106,078 B1 * | 9/2006 | Frank ..................... G01R 27/02 |
| | | 324/547 |
| 7,119,548 B1 | 10/2006 | Cook et al. |

(Continued)

FOREIGN PATENT DOCUMENTS

| CN | 1268670 A | 10/2000 |
| CN | 102590648 A | 7/2012 |

(Continued)

OTHER PUBLICATIONS

CT Analyzer, Revolution in Current Transformer Testing and Calibration, Omicron, L2065, Nov. 2012, pp. 1-10.
Russian search report.

*Primary Examiner* — Noam Reisner
(74) *Attorney, Agent, or Firm* — Seyfarth Shaw LLP; Brian Michaelis (57) ABSTRACT

A transformer testing device (10) comprises outputs (31-33) for detachably connecting the transformer testing device to windings of multiple phases of a transformer (50). The transformer testing device (10) further comprises a plurality of sources (21-23), each of which is designed to generate a test signal. The transformer testing device (10) also comprises a switching matrix (40) that is connected between the plurality of sources (21-23) and the outputs (31-33).

13 Claims, 8 Drawing Sheets (56) References Cited

U.S. PATENT DOCUMENTS

2012/0139555 A1    6/2012  Mayfield et al.
2014/0125351 A1*   5/2014  Woodward, Jr. ..... G01R 31/027
                                                      324/537
2014/0191774 A1*   7/2014  Muller ................ G01R 27/14
                                                      324/713

FOREIGN PATENT DOCUMENTS

CN      102621459 A     8/2012
RU        2506600 C1    2/2014
WO    2012/155278 A1   11/2012
WO     2012155278 A1   11/2012

* cited by examiner

TRANSFORMER TESTING DEVICE, AND METHOD FOR TESTING A TRANSFORMER

FIELD OF THE INVENTION

The invention relates to a transformer testing device, and to a method for testing transformers. The invention relates in particular to such devices and methods which are configured for testing a three-phase transformer.

BACKGROUND

Transformers are used as parts of power supply systems. Transformers can be used for voltage conversion from a first value on a high-voltage side to a second value, which is less than the first value, on a low-voltage side.

The determination of properties of a transformer by a transformer test in which one or more characteristic variables of the transformer are ascertained by measurement is necessary for example for ensuring operational reliability, for driving, or for further reasons. Examples of such transformer tests include the determination of a static resistance, the determination of a dynamic resistance, the determination of a transmission ratio and/or the determination of a leakage impedance or leakage inductance. In the case of a static resistance measurement, a DC current can be fed into a winding of the transformer, and the voltage can be measured. In the case of a dynamic resistance measurement, the transmission ratio of the transformer can be switched over using a tap switch during the measurement. A voltage, a current and/or a resistance can be detected and evaluated. By way of example, conclusions about a state of the tap switch can be drawn from the profile of the measured parameters.

A transformer testing device can be configured for carrying out measurements on a three-phase transformer. In order to achieve flexibility when carrying out different measurements, redistribution wirings can conventionally be implemented, which increase the labor and time expenditure for the transformer test. Alternatively, the transformer testing device can be combined with an external unit connected between the transformer testing device and the transformer to be tested. However, this entails the risk of faulty connections between transformer testing device and external unit and likewise leads to an increase in the labor and time expenditure.

SUMMARY OF THE INVENTION

There is a need for devices and methods with which a transformer test can be implemented efficiently and flexibly. In particular there is a need for devices and methods which allow a test of a three-phase transformer and which afford additional flexibility with regard to the outputting of test signals.

According to exemplary embodiments, a transformer testing device and a method for testing a transformer are specified in which the transformer testing device also comprises a switching matrix in addition to a plurality of sources for generating test signals. The switching matrix is controllable to selectively combine the plurality of sources.

The transformer testing device can allow the production of a series connection of the plurality of sources in order to output a test signal having an increased voltage amplitude to one of the phases of the transformer. The transformer testing device can allow the production of a parallel connection of the plurality of sources in order to output a test signal having an increased current amplitude to one of the phases of the transformer.

Such a transformer testing device makes it possible to achieve increased flexibility in the course of testing, since test signals from different sources can be allocated to a plurality of outputs in different ways. It is possible to perform a selective increase in the test signal for at least one of the phases by combination of a plurality of sources if this is desired for example with regard to a target accuracy of a measurement.

A transformer testing device according to one exemplary embodiment comprises outputs for releasably connecting the transformer testing device to a plurality of phases of the transformer. The transformer testing device comprises a plurality of sources, wherein each source of the plurality of sources is configured in each case for generating a test signal. The transformer testing device comprises a switching matrix connected between the plurality of sources and the outputs.

The switching matrix can be controllable to connect the plurality of sources in series.

The switching matrix can be controllable to connect the plurality of sources in parallel.

The switching matrix can comprise a plurality of controllable switching means. The controllable switching means can comprise one or a plurality of relays. The controllable switching means can comprise one or a plurality of power transistors.

The transformer testing device can comprise a control unit for controlling the switching matrix, which is connected to at least one controllable switching means of the switching matrix.

The transformer testing device can comprise a housing, wherein the plurality of sources and the switching matrix are arranged in the housing.

The control unit can be configured to drive the switching matrix such that, in a first state of the switching matrix, each of the plurality of outputs is conductively connected to respectively only one source, and that, in a second state of the switching matrix, at least one output of the plurality of outputs receives the test signal generated by at least two different sources.

The control unit can be configured to control the switching matrix depending on an input received at a user interface.

The user interface can be configured to enable a selection between a simultaneous test of three phases of the transformer and a test of only one phase of the transformer.

Each source of the plurality of sources can be configured to operate as a voltage source.

Each source of the plurality of sources can be configured to operate as a current source.

Each source of the plurality of sources can be controllable such that it operates optionally as a voltage source or as a current source.

The sources can be configured to generate a test signal which is an alternating signal.

The sources can be configured to generate a test signal which is a DC current signal or a DC voltage signal.

The transformer testing device can comprise at least one controllable switch to short-circuit at least one of the phases of the transformer on a high-voltage side or on a low-voltage side. The controllable switch can be integrated into the switching matrix.

The transformer testing device can comprise at least three mutually different sources. The transformer testing device can comprise only three mutually different sources in order to enable a mutually independent test of all the phases of a three-phase transformer.

The transformer testing device can be configured to be connected to a high-voltage side of the transformer in order to provide the test signal to at least one of the phases.

The transformer testing device can be configured to be connected to a low-voltage side of the transformer in order to provide the test signal to at least one of the phases.

The switching matrix can be configured to couple the sources optionally to the high-voltage side or the low-voltage side of the transformer without redistribution wiring between the transformer testing device and the transformer.

The transformer testing device can comprise at least one measuring unit for detecting a test response of the transformer. The transformer testing device can comprise a plurality of measuring units for detecting test responses of the plurality of phases of the transformer.

A system according to one exemplary embodiment comprises a transformer having a plurality of phases, and a transformer testing device according to one exemplary embodiment, which is releasably connected to the plurality of phases of the transformer via the outputs.

The transformer can be a three-phase transformer.

The transformer testing device can be connected to a high-voltage side of the transformer.

The transformer testing device can be connected to a low-voltage side of the transformer.

A method for testing a transformer having a plurality of phases is performed according to one exemplary embodiment with a transformer testing device having outputs for releasably connecting the transformer testing device to the transformer. The method comprises controlling a plurality of sources of the transformer testing device in each case for generating a test signal. The method comprises controlling a switching matrix of the transformer testing device to conductively connect at least one output of the transformer testing device selectively to one or a plurality of the sources.

The method can be performed with the transformer testing device or the system according to one exemplary embodiment.

In the method, the switching matrix can be controlled to connect the plurality of sources in series.

In the method, the switching matrix can be controlled to connect the plurality of sources in parallel.

In the method, the transformer testing device can comprise a housing, wherein the plurality of sources and the switching matrix are arranged in the housing.

In the method, a control unit of the transformer testing device can drive the switching matrix such that, in a first state of the switching matrix, each of the plurality of outputs is conductively connected to respectively only one source, and that, in a second state of the switching matrix, at least one output of the plurality of outputs receives the test signal generated by at least two different sources.

In the method, the control unit can control the switching matrix depending on an input received at a user interface.

In the method, a user input with which a selection is made between a simultaneous test of three phases of the transformer and a test of only one phase of the transformer can be received at the user interface.

In the method, each source of the plurality of sources can operate as a voltage source.

In the method, each source of the plurality of sources can operate as a current source.

In the method, each source of the plurality of sources can be driven such that it operates optionally as a voltage source or as a current source.

The method can comprise short-circuiting at least one of the phases of the transformer on a high-voltage side or on a low-voltage side with a controllable switch of the transformer testing device. The controllable switch can be integrated into the switching matrix.

In the method, the transformer testing device can comprise at least three mutually different sources. The transformer testing device can comprise only three mutually different sources in order to enable a mutually independent test of all the phases of a three-phase transformer.

In the method, the transformer testing device can be connected to a high-voltage side of the transformer.

In the method, the transformer testing device can be connected to a low-voltage side of the transformer.

The method can comprise detecting at least one test response of the transformer with a measuring unit of the transformer testing device.

The method can comprise detecting test responses of the plurality of phases of the transformer with a plurality of measuring units of the transformer testing device.

In transformer testing devices, systems and methods according to exemplary embodiments, a plurality of sources can be combined with one another without a separate unit having to be provided between the transformer testing devices and the transformer for this purpose.

Different effects can be achieved with transformer testing devices, systems and methods according to exemplary embodiments. The time duration required for the test can be reduced. In particular, flexibility can be achieved without additional redistribution wirings.

Transformers having a multiplicity of different configurations are used in practice. The properties of the transformers vary accordingly. Transformer testing devices, systems and methods according to the exemplary embodiments make it possible to test a great diversity of transformers having a multiplicity of different configurations.

Transformer testing devices, systems and methods according to exemplary embodiments allow the accuracy of the determination of characteristic variables to be increased by measurement currents and/or measurement voltages being correspondingly adapted.

Transformer testing devices, systems and methods according to exemplary embodiments allow more extensive automation of transformer tests.

BRIEF DESCRIPTION OF THE FIGURES

The invention is explained in greater detail below on the basis of preferred embodiments with reference to the drawings. In the drawings, identical reference signs designate identical elements.

DETAILED DESCRIPTION OF EXEMPLARY EMBODIMENTS

The present invention is explained in greater detail below on the basis of preferred embodiments with reference to the drawings. In the figures, identical reference signs designate identical or similar elements. The figures are schematic illustrations of various embodiments of the invention. Elements illustrated in the figures are not necessarily illustrated in a manner true to scale. Rather, the various elements illustrated in the figures are rendered in such a way that their function and their purpose become understandable to the person skilled in the art.

Connections and couplings between functional units and elements as illustrated in the figures can also be implemented as indirect connection or coupling. A connection or coupling can be implemented in a wired fashion or in a wireless fashion.

Devices and methods for carrying out a transformer test with a transformer testing device are described in detail below. The transformer can be a transformer for high- or medium-voltage power supply systems. The transformer can be a transformer installed in a power plant or substation. The transformer testing device can be a mobile appliance that allows the transformer test to be carried out on the installed transformer.

The transformer testing device is configured to be connected to at least one phase and preferably to a plurality of phases of the transformer. As described more thoroughly below, the transformer testing device comprises a plurality of sources. A switching matrix allows each of the plurality of phases of the transformer selectively to be provided with a respective test signal, wherein the test signals applied to different phases are generated by different sources. By driving the switching matrix, it is possible for the plurality of sources to be interconnected, for example in a series connection or parallel connection, such that a plurality of test signals can be combined with one another and can be applied to one of the phases.

The transformer testing device comprises a switching matrix, which can comprise a plurality of controllable switching means. The controllable switching means can each be a relay or some other switch which is configured for switching a load circuit under the control of a control circuit. The controllable switching means can each be an insulated gate bipolar transistor (IGBT) or a field effect transistor (FET) or can comprise an IGBT or an FET.

The switching matrix can be driven automatically. By way of example, the switching matrix can be driven automatically if an increase in an amplitude of a test signal is desired for one of the phases.

Figure 1:
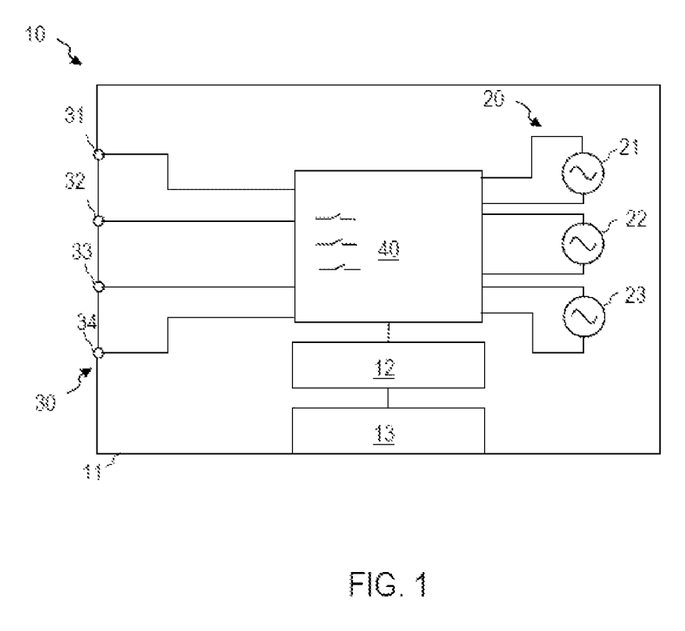
FIG. 1 shows a transformer testing device according to one exemplary embodiment.

FIG. 1 shows a transformer testing device 10 according to one exemplary embodiment. The transformer testing device 10 can be a testing device for a three-phase transformer.

The transformer testing device 10 has a housing 11, on which a plurality of outputs 30 are provided in order to impress test signals on different phases of a transformer.

The transformer testing device 10 has a plurality of sources 20. By way of example, three sources 21-23 or more than three sources can be integrated into the housing 11. The sources 21-23 can be arranged in a manner spaced apart from one another in the housing 11. One or a plurality of the sources 21-23 can be a current source that is controllable to generate a DC current and/or an AC current as test signal. One or a plurality of the sources 21-23 can be controllable to generate AC currents having a plurality of different frequencies as test signal. One or a plurality of the sources 21-23 can be a voltage source that is controllable to generate a DC voltage and/or an AC voltage as test signal. One or a plurality of sources 21-23 can be controllable to generate AC voltages having a plurality of different frequencies as test signal.

The sources 21-23 can be operable in different operating modes, for example as current source or as voltage source and/or as source of a temporally constant signal or of an alternating signal.

The transformer testing device 10 comprises a switching matrix 40 connected between the sources 21-23 and the outputs 31-34. As will be described even more thoroughly, the switching matrix 40 is controllable to combine test signals generated by a plurality of different sources 21-23.

The switching matrix 40 can be controllable such that, in a first state, in which different phases of a transformer can be tested in parallel, a test signal generated by only one of the sources 21-23 is respectively present at each of a plurality of outputs 31-33. By way of example, in the first state, a signal generated by a first source 21 can be output at a first output 31. In the first state, a signal generated by a second source 22 can be output at a second output 32. In the first state, a signal generated by a third source 23 can be output at a third output 33. The switching matrix 40 can be configured such that, in the first state, the signal of each of the plurality of sources 21-23 is passed in each case only to exactly one of the outputs 31-33, such that each of the outputs 31-33 is conductively connected to a different one of the plurality of sources 21-23.

The switching matrix 40 can be controllable such that, in a second state, a test signal having an increased amplitude can be output via at least one of the outputs 31-33. In the second state, it is possible for at least one other output to be conductively connected to none of the sources 21-23. By way of example, in the second state, a signal generated by a series or parallel connection of at least two sources 21-23 can be output at a first output 31. In the second state of the switching matrix 40, a signal generated by a series or parallel connection of all the sources 21-23 can be output at the first output 31. In the first state, a second output 32 and/or a third output 33 can be disconnected from each of the sources 21-23 by the switching matrix 40.

The transformer testing device 10 can comprise further units, for example one or a plurality of measuring units for detecting a test response as a reaction to the test signal. The transformer testing device 10 can comprise a control unit 12 for automatically electrically controlling the switching matrix 40. The control unit 12 can also be configured for controlling the plurality of sources 21-23.

The transformer testing device 10 can comprise an evaluation unit for evaluating a test response of the transformer, said test response being detected by means of the measuring unit or the measuring units. The functions of the control unit 12 and/or of the evaluation unit can be performed by a processor or some other integrated semiconductor circuit.

The transformer testing device 10 can comprise a user interface 13. The user interface 13 can be a graphical user interface. The user interface 13 can make possible for the user a selection which stipulates whether and, if appropriate, in what temporal sequence a plurality of the sources 21-23 are combined in a series or parallel connection by the switching matrix 40.

Figure 2:
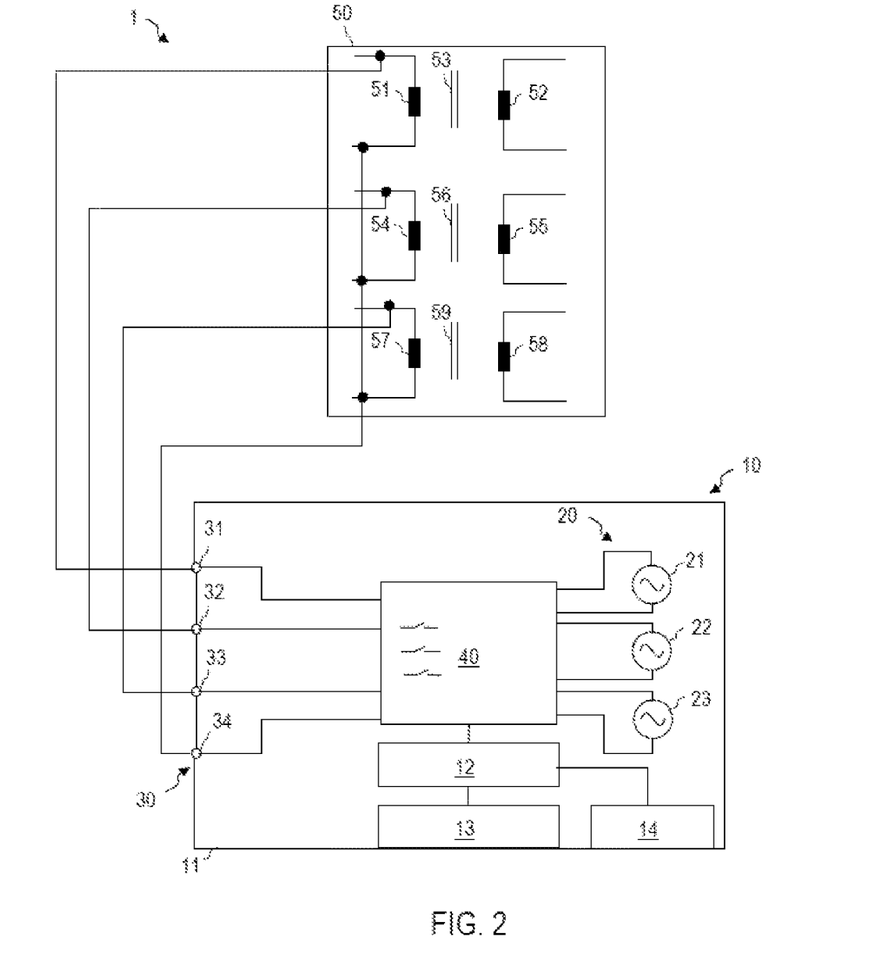
FIG. 2 shows a system comprising a transformer testing device according to one exemplary embodiment.

FIG. 2 is an illustration of a system 1 comprising a transformer testing device 10 and a transformer 50. The transformer 50 can be a transformer for high- or medium-voltage power supply systems. The transformer 50 can be a transformer 50 installed in a power plant or substation. The transformer testing device 10 can be a mobile appliance that allows the transformer test to be carried out on the installed transformer 50.

The transformer 50 can be a three-phase transformer. The transformer has a phase having a winding 51 on a high-voltage side, a winding 52 on a low-voltage side and a core 53. The transformer has a further phase having a winding 54 on a high-voltage side, a winding 55 on a low-voltage side and a core 56. The transformer can have a further phase having a winding 57 on a high-voltage side, a winding 58 on a low-voltage side and a core 59.

The plurality of terminals 30 of the transformer testing device 10 are connected to the plurality of phases of the transformer 50. By way of example, each of the terminals 31-33, via which a test signal can be output by the transformer testing device, can be connected to in each case only one of the phases of the transformer 50.

Since a combination of different sources 21-23 can be effected by the switching matrix 40 integrated into the transformer testing device 10, lines which are connected to the outputs 31-33 can be directly connected to the transformer. It is not necessary to provide an external unit between the transformer testing device 10 and the transformer 50.

The transformer testing device 10 has one measuring unit 14 or a plurality of measuring units 14, which can be integrated into the housing 11. The transformer testing device 10 can be configured such that different measurements can be carried out, without the connections between the transformer testing device 10 and the transformer 50 having to be released and/or connected differently. The different measurements can be performed without the need to carry out redistribution wiring for the test specimen. The measurements can be carried out by the transformer testing device 10 in a completely or partly automated manner, i.e. without interaction of the user between the measurements.

The transformer testing device 10 can be configured to perform one measurement or a plurality of measurements on the transformer 50 which are selected from the group consisting of a short-circuit impedance measurement, a winding resistance measurement, a transformation measurement, a demagnetization measurement and/or a leakage inductance measurement.

By way of example, the transformer testing device 10 can perform a transformation measurement. For this purpose, the sources 21-23 can be operated in each case as an AC voltage source. A voltage at the windings 51, 54, 57 can be detected. A voltage at the winding 52, 55, 58 on the low-voltage side can be detected for example by means of the measuring unit 14. From a ratio of the voltages, the transmission ratio for each of the phases can be determined by the transformer testing device 10.

The transformer testing device 10 can alternatively or additionally be configured to perform a short-circuit impedance measurement. For this purpose, the sources 21-23 can be operated in each case as an AC current source. A controllable switching means integrated into the transformer testing device 10, which controllable switching means is not illustrated in FIG. 2, can be connected to one of the windings 51, 54, 57 and can be driven such that the corresponding winding is automatically short-circuited. It is possible to detect the AC voltage dropped across the winding in order to ascertain the short-circuit impedance.

The transformer testing device 10 can alternatively or additionally be configured to perform a winding resistance measurement. The resistance measurement can be a static resistance measurement. The winding resistance of one of the windings 51, 54, 57 can be determined. For determining the winding resistance, the sources 21-23 can operate in each case as a DC current source. The voltage at the windings 51, 54, 57 can be measured by the first measuring unit 14. The DC current can be impressed until the iron core 53, 56, 59 of the respective phase enters saturation in order to perform the winding resistance measurement.

For at least one or a plurality of the measurements performed, the transformer testing device 10 can automatically interconnect a plurality of the sources 21-23 in a series or parallel connection in order to increase the magnitude of the impressed test signal. More accurate measurement results can be achieved in this way.

For at least another of the measurements performed, the transformer testing device 10 can control the switching matrix 40 such that the sources 21-23 are not interconnected in a series or parallel connection. Measurements on different phases can be performed in a temporally overlapping manner and in particular simultaneously in order to reduce the total time required for transformer testing.

Different techniques can be used to determine whether the switching matrix 40 is intended to be controlled such that a plurality of the sources 21-23 are interconnected in a series or parallel connection. By way of example, depending on a setpoint accuracy of the measurement, which is predefinable automatically or in a user-defined manner, the control unit 12 can determine whether the plurality of sources 21-23 are interconnected in a series or parallel connection. The corresponding measurements can then be performed sequentially on the different phases of the transformer 50. Alternatively or additionally, a user input at the user interface 13 can make it possible to stipulate whether and, if appropriate, for which measurements the plurality of sources 21-23 are interconnected in a series or parallel connection. Alternatively or additionally, the control unit 12 can determine automatically, depending on a test response of the transformer 50, whether a higher amplitude of the test signal is required and the plurality of sources 21-23 are interconnected in a series or parallel connection to that end.

Figure 3:
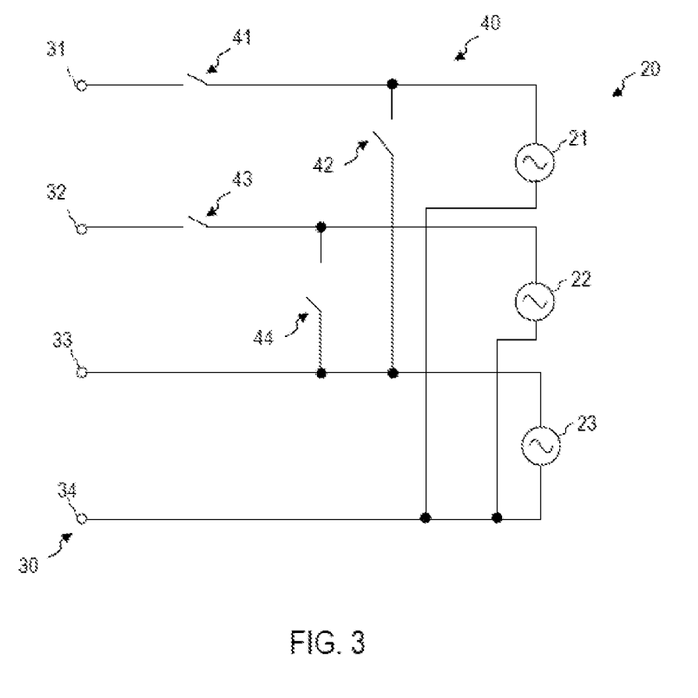
FIG. 3 shows a transformer testing device according to one exemplary embodiment.

The switching matrix can have a diversity of different configurations. Exemplary configurations are explained in greater detail with reference to FIG. 3 to FIG. 5. FIG. 3 schematically shows the switching matrix 40 of a transformer testing device 40 according to one exemplary embodiment.

The switching matrix 40 has a plurality of controllable switching means 41-44. Each of the controllable switching means 41-44 can be in each case a relay or some other switch which is configured for switching a load circuit under the control of a control circuit. The controllable switching means can each be an insulated gate bipolar transistor (IGBT) or a field effect transistor (FET) or can comprise an IGBT or an FET.

One output 34 can serve as a common terminal for a plurality of phases. The output 34 can be connected to ground or can serve as a current sink in a different way. The other outputs 31-33 can each be connected to windings of different phases of the transformer 50.

The first source 21 has two terminals. A first terminal of the first source 21 is connected to the first output 31 via a first controllable switching means 41. The first terminal of the first source 21 is connected to the third output 33 via a second controllable switching means 42. The second terminal of the first source 21 is connected to the output 34.

The second source 22 has two terminals. A first terminal of the second source 22 is connected to the second output 32 via a third controllable switching means 43. The first terminal of the second source 22 is connected to the third output 33 via a fourth controllable switching means 44. The second terminal of the second source 22 is connected to the output 34.

The third source 23 has two terminals. A first terminal of the third source 23 is connected to the third output 33. A second terminal of the third source 23 is connected to the output 34.

The use of the transformer testing device having the switching matrix 40 is not restricted to the case where the transformer has a primary-side star connection. By way of example, methods and devices can also be used if the phases are interconnected in a delta configuration.

The switching matrix 40 can be configured to switch the sources selectively between different phases. Alternatively or additionally, the switching matrix 40 can be configured to connect the sources optionally to the primary side of the transformer or to the secondary side.

By driving the first controllable switching means 41 and the second controllable switching means 42, it is possible for the first source 21 to be selectively connected in parallel with the third source 23. If the first controllable switching means 41 is controlled such that it is closed, and the second controllable switching means 42 is to controlled such that it is open, the first test signal generated by the first source 21 is present at a first phase of the transformer 50 via the first output 31. If the first controllable switching means 41 is controlled such that it is open, and the second controllable switching means 42 is controlled such that it is closed, the first test signal generated by the first source 21 is combined with the third test signal generated by the third source 23 and optionally with the second test signal generated by the second source 22, in order to provide a signal for testing the third phase of the transformer 50 via the third output 33.

By driving the third controllable switching means 43 and the second controllable switching means 42, it is possible for the second source 22 to be selectively connected in parallel with the third source 23. If the third controllable switching means 43 is controlled such that it is closed, and the fourth controllable switching means 44 is controlled such that it is open, the second test signal generated by the second source 22 is present at a second phase of the transformer 50 via the second output 32. If the third controllable switching means 43 is controlled such that it is open, and the fourth controllable switching means 44 is controlled such that it is closed, the second test signal generated by the second source 22 is combined with the third test signal generated by the third source 23 and optionally with the first test signal generated by the first source 21, in order to provide a signal for testing the third phase of the transformer 50 via the third output 33.

By driving the controllable switching means 41-44, it is possible for the first source 21, the second source 22 and the third source 23 to be connected in parallel. As a result, for example, if the sources 21-23 are operated as current sources, it is possible to output a test signal having a higher current amplitude for improving the accuracy of the test.

The switching matrix 40 can comprise further controllable switching means in order to allow the signal generated by the parallel connection of the first source 21, the second source 22 and the third source 23 to be able optionally to be impressed into each of the different phases of the transformer 50.

The switching matrix 40 can comprise further controllable switching means in order to allow the signal generated by the parallel connection of the first source 21, the second source 22 and the third source 23 optionally to be impressed into the high-voltage side or the low-voltage side of the transformer.

Figure 4:
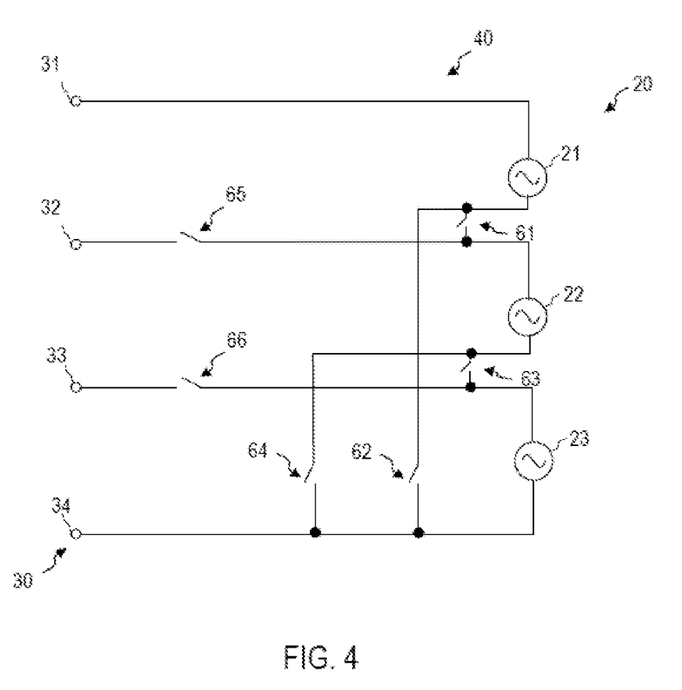
FIG. 4 shows a transformer testing device according to one exemplary embodiment.

FIG. 4 schematically shows the switching matrix 40 of a transformer testing device 40 according to one exemplary embodiment. The switching matrix 40 is configured such that the plurality of sources 21-23 can be interconnected in series.

The switching matrix 40 has a plurality of controllable switching means 61-66. Each of the controllable switching means 61-66 can be in each case a relay or some other switch which is configured for switching a load circuit under the control of a control circuit. The controllable switching means can each be an insulated gate bipolar transistor (IGBT) or a field effect transistor (FET) or can comprise an IGBT or an FET.

One output 34 serves as a common terminal for a plurality of phases in order to define a reference potential. The output 34 can be connected to ground or some other reference potential. The other outputs 31-33 can be connected in each case to windings of different phases of the transformer 50.

The first source 21 has two terminals. A first terminal of the first source 21 is connected to the first output 31. The second terminal of the first source 21 is connected to a first terminal of the second source 22 via a first controllable switching means 61. The second terminal of the first source 21 is connected to the output 34 via a second controllable switching means 62.

The second source 22 has two terminals. A first terminal of the second source 22 is connected to the second output 32 via a fifth controllable switching means 65. The second terminal of the second source 22 is connected to a first terminal of the first source 21 via a third controllable switching means 64. The second terminal of the second source 22 is connected to the output 34 via a fourth controllable switching means 64.

The third source 23 has two terminals. A first terminal of the third source 23 is connected to the third output 33 via a sixth controllable switching means 66. A second terminal of the third source 23 is connected to the output 34.

By driving the controllable switching means 61-65 of the switching matrix 40, it is possible for two or more than two sources 21-23 to be selectively interconnected in series.

By way of example, the switching matrix 40 can be driven in such a way that the first switching means 61 is open, the second switching means 62 is closed, the third switching means 63 is open, the fourth switching means 64 is closed, the fifth switching means 65 is closed and the sixth switching means 66 is closed. What can be achieved as a result is that the first test signal of the first source 21 is provided to the first phase of the transformer via the first output 31, the second test signal of the second source 22 is provided to the second phase of the transformer via the second output 32 and the third test signal of the third source 23 is provided to the third phase of the transformer via the third output 33.

The switching matrix 40 can be driven in such a way that the first switching means 61 is closed, the second switching means 62 is open, the third switching means 63 is open, the fourth switching means 64 is closed, the fifth switching means 65 is open and the sixth switching means 66 is closed. What can be achieved as a result is that the first source 21 and the second source 22 are connected in series. A signal formed from combination of the first test signal of the first source 21 and the second test signal of the second source 22 can be impressed into the first phase of the transformer via the first output 31.

The switching matrix 40 can be driven in such a way that the first switching means 61 is closed, the second switching means 62 is open, the third switching means 63 is closed, the fourth switching means 64 is open, the fifth switching means 65 is open and the sixth switching means 66 is open. What can be achieved as a result is that the first source 21, the second source 22 and the third source 23 are connected in series. A signal formed from combination of the first test signal of the first source 21, the second test signal of the second source 22 and the third test signal of the third source 23 can be impressed into the first phase of the transformer via the first output 31.

By driving the controllable switching means 61-66, it is possible for the first source 21, the second source 22 and the third source 23 to be connected in series. As a result, for example, if the sources 21-23 are operated as voltage sources, it is possible to output a test signal having a higher voltage amplitude for improving the accuracy of the test.

Figure 5:
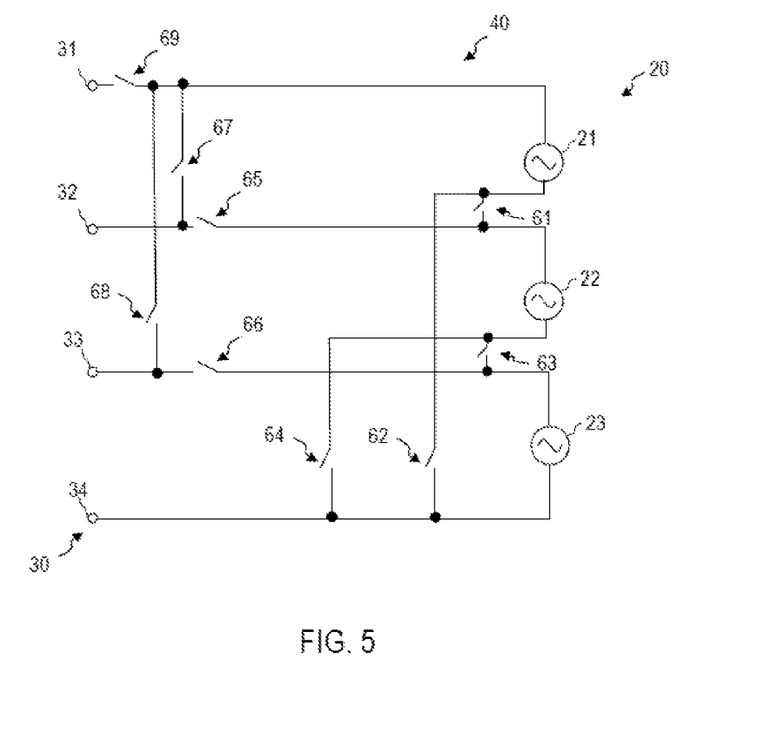
FIG. 5 shows a transformer testing device according to one exemplary embodiment.

The switching matrix 40 can comprise further controllable switching means in order to allow the signal generated by the series connection of the first source 21, the second source 22 and the third source 23 to be able optionally to be impressed into each of the different phases of the transformer 50, as illustrated in FIG. 5.

The use of the transformer testing device having the switching matrix 40 is not restricted to the case where the transformer has a primary-side star connection. By way of example, methods and devices can also be used if the phases are interconnected in a delta configuration.

The switching matrix 40 can be configured to switch the sources selectively between different phases. Alternatively or additionally, the switching matrix 40 can be configured to connect the sources optionally to the primary side of the transformer or to the secondary side.

FIG. 5 schematically shows the switching matrix 40 of a transformer testing device 40 according to one exemplary embodiment. The switching matrix 40 is configured such that the plurality of sources 21-23 can be interconnected in series. The output signal of the series connection of the sources 21-23 can be selectively passed to each of the outputs 31-33 by further switching means 67-69.

The switching matrix 40 has a plurality of controllable switching means 61-66, which can be configured as described with reference to FIG. 4. Furthermore, the switching matrix 40 has a seventh controllable switching means 67, an eighth controllable switching means 68 and a ninth controllable switching means 69. Each of the controllable switching means 61-69 can be in each case a relay or some other switch which is configured for switching a load circuit under the control of a control circuit. The controllable switching means can each be an insulated gate bipolar transistor (IGBT) or a field effect transistor (FET) or can comprise an IGBT or an FET.

A series connection of the first source 21, the second source 22 and the third source 23 can be produced by, for example, the switching matrix 40 being driven in such a way that the first switching means 61 is closed, the second switching means 62 is open, the third switching means 63 is closed, the fourth switching means 64 is open, the fifth switching means 65 is open and the sixth switching means 66 is open.

If the ninth controllable switching means 69 is closed and if the seventh controllable switching means 67 and the eighth controllable switching means 68 are open, the output signal of the series connection of the sources 21-23 is impressed on a first phase of the transformer via the first output 31.

If the seventh controllable switching means 67 is closed and if the eighth controllable switching means 68 and the ninth controllable switching means 69 are open, the output signal of the series connection of the sources 21-23 is impressed on a second phase of the transformer via the second output 32.

If the eighth controllable switching means 68 is closed and if the seventh controllable switching means 67 and the ninth controllable switching means 69 are open, the output signal of the series connection of the sources 21-23 is impressed on a third phase of the transformer via the third output 33.

By driving the switching matrix 40, it is possible to produce a series connection of the sources 21-23, the output signal of which can be fed sequentially to each of the different phases of the transformer.

A multiplicity of further configurations of the switching matrix 40 are possible. By way of example, the switching matrix 40 can have controllable switching means 41-44 as described with reference to FIG. 3, and controllable switching means 61-66 or 61-69 as described with reference to FIG. 4 and FIG. 5, in order optionally to produce a parallel connection or a series connection of the sources 21-23. This can be advantageous particularly if the sources 21-23 can be operated both as voltage sources and as current sources.

Further controllable switches can be integrated into the switching matrix 40 or be provided in addition to the switching matrix 40. By way of example, one or a plurality of controllable switches can be integrated into the transformer testing device 10 in order to short-circuit windings on the high-voltage side and/or on the low-voltage side of the transformer 50.

One or a plurality of controllable switches can be integrated into the transformer testing device 10 in order to connect one or a plurality of sources 21-23 or a parallel or series connection of one or a plurality of sources optionally to at least one winding on the high-voltage side or at least one winding on the low-voltage side of the transformer 50.

Figure 6:
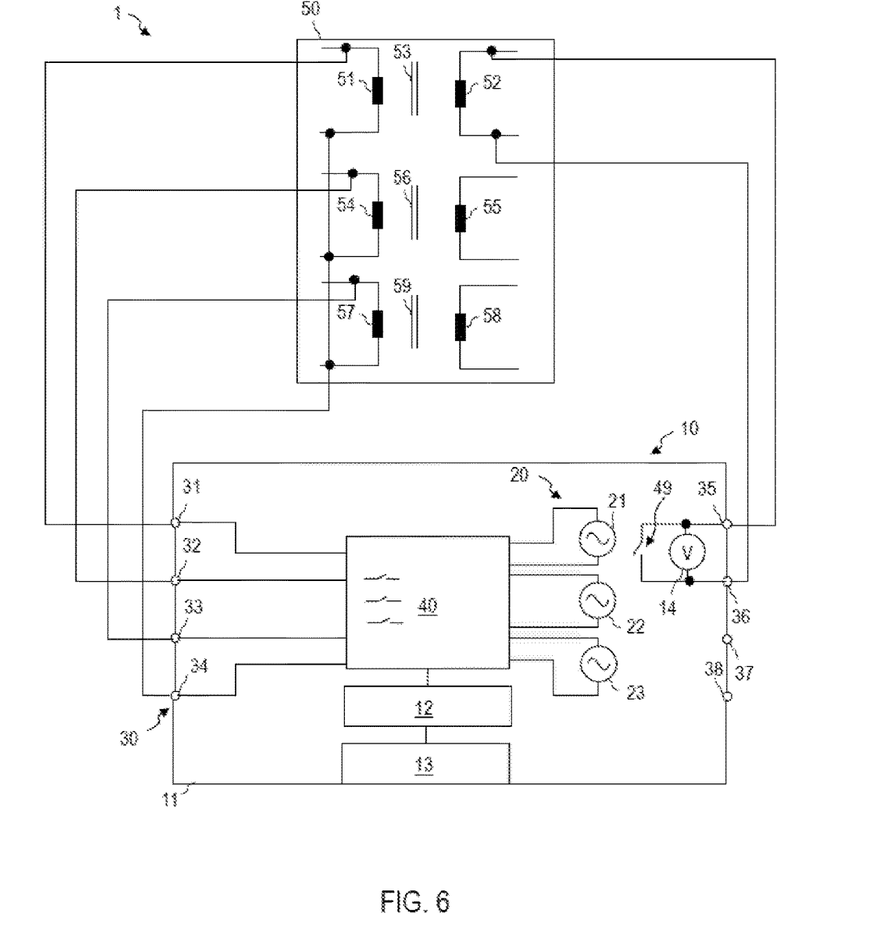
FIG. 6 shows a system comprising a transformer testing device according to one exemplary embodiment.

FIG. 6 shows a schematic illustration of a system 1 comprising a transformer testing device 10 according to one exemplary embodiment. The transformer testing device 10 has terminals 35-38 configured for a coupling to windings on the high-voltage side and/or low-voltage side of the transformer 50.

A controllable switch 49 can be integrated into the switching matrix 40 or be provided in addition to the switching matrix 40. The controllable switch 49 is arranged in the housing 11 of the transformer testing device 10 and can be configured as a short-circuit switch. By driving the controllable switch 49, it is possible for at least one winding of the transformer 50 to be short-circuited. The controllable switch 49 can be actuated in a time-dependent manner, for example in order to amplify the test response after magnetization of a transformer core, said test response being detected as a reaction to a test signal.

Even though only one controllable switch 49 is illustrated by way of example in FIG. 6, the transformer testing device 10 can have a plurality of such controllable switches 49 serving as short-circuit switches. One or a plurality of short-circuit switches can be connectable to a plurality of different windings of the transformer via the switching matrix 40.

The transformer testing device 10 can have different measuring units, such as voltage measuring units 14 or current measuring units.

Figure 7:
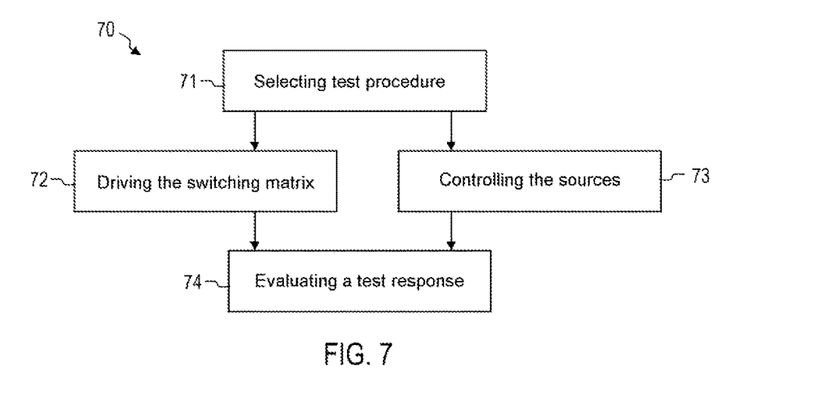
FIG. 7 is a flow diagram of a method according to one exemplary embodiment.

FIG. 7 is a flow diagram of a method 70 according one exemplary embodiment. The method 70 can be performed automatically by the transformer testing device 10 according to one exemplary embodiment.

In step 71, selection of a test procedure can be carried out. The test procedure can comprise one or a plurality of measurements that are performed on the transformer 50. The test procedure can be selected from a plurality of test procedures in a user-defined manner.

In step 72, the switching matrix 40 is controlled. The switching matrix 40 can be controlled in a time-dependent manner depending on the selected test procedure. The controllable switching means of the switching matrix 40 can be controlled automatically such that two, three or more than three sources of the transformer testing device 10 are combined in a series connection during at least part of the test procedure.

Step 73 involves controlling the sources 21-23 for generating the test signal. The sources 21-23 can be controlled such that they optionally generate a DC current, a DC voltage or an AC voltage. Different test signals can also be generated in a time-dependent manner.

The driving of the sources 21-23 and the driving of the switching matrix 40 can be temporally coordinated with one another. By way of example, in part of a test procedure in which the sources 21-23 operate as current sources, the switching matrix 40 can be controlled such that the sources 21-23 are connected in parallel. In part of a test procedure in which the sources 21-23 operate as voltage sources, the switching matrix 40 can be controlled such that the sources 21-23 are connected in series.

In step 74, a test response of the transformer 50 can be automatically evaluated. The evaluation can comprise the determination of a winding resistance in the case of a static resistance measurement, the determination of a leakage impedance, the determination of a leakage inductance, the determination of a transmission ratio or the determination of a combination of two or more than two of these characteristic variables.

Figure 8:
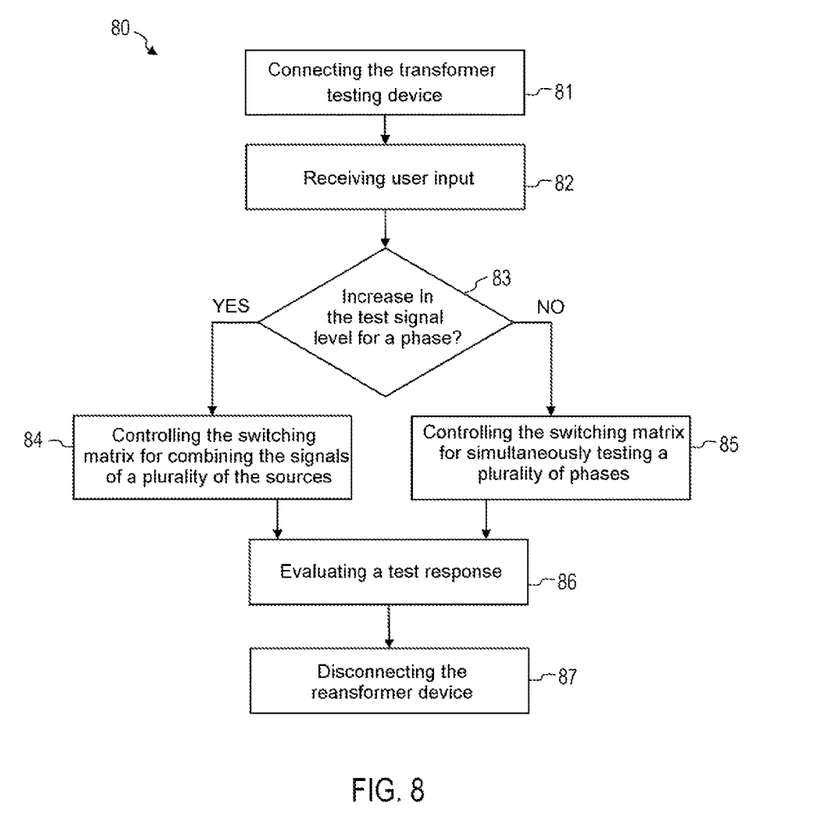
FIG. 8 is a flow diagram of a method according to one exemplary embodiment.

The switching matrix 40 can be switched once or multiply during the test procedure. FIG. 8 is a flow diagram of a method 80 according to one exemplary embodiment. The method 80 can be performed automatically by the transformer testing device 10 for the purpose of testing a transformer comprising a tap switch.

In step 81, the transformer testing device 10 is releasably connected to the transformer 50.

In step 82, a user input can be received by the transformer testing device 10. The user input can select a test procedure. The user input can stipulate whether a plurality of sources 21-23 of the transformer testing device 10 are combined in a series or parallel connection at least during part of the test procedure.

In step 83, it is possible to check whether a level of a test signal applied to one of the plurality of phases of the transformer is intended to be selectively increased. The checking can be carried out depending on the user input received in step 81. The checking can additionally or alternatively be carried out depending on a test response of the transformer 50. By way of example, if the measurement accuracy of a measurement variable that is achieved depending on the test response does not attain a setpoint accuracy, which can be predefinable in a user-defined manner, the transformer testing device 10 can recognize that the level of the test signal is intended to be increased by two, three or more sources 21-23 being interconnected in series or in parallel. If the level is intended to be increased, the method can be continued in step 84. Otherwise the method can be continued in step 85.

In step 84, the switching matrix 40 can be controlled such that two, three or more sources 21-23 of the transformer testing device are connected in series or in parallel. The test signal having an increased level can be applied sequentially to windings of different phases of the transformer.

In step 85, the switching matrix 40 can be controlled such that a respective test signal is fed to windings of a plurality of phases of the transformer in a temporally overlapping manner.

In step 86, a test response can be evaluated. The evaluation of the test response can comprise the determination of a winding resistance in the case of a static resistance measurement, the determination of a leakage impedance, the determination of a leakage inductance, the determination of a transmission ratio or the determination of a combination of two or more than two of these characteristic variables.

In step 87, the transformer testing device can be disconnected from the transformer. An automatic further evaluation and/or archiving of the results of the transformer testing by the transformer testing device can be carried out.

While exemplary embodiments have been described in detail with reference to the figures, alternative or additional features can be used in further exemplary embodiments. While the use of a transformer testing device in combination with a three-phase transformer has been described, for example, the devices and methods according to exemplary embodiments can also be used for transformers having a different number of phases.

In the devices, systems and methods, the sources can generate different test signals. By way of example, one of the sources can be operated as a voltage source, while another of the sources is simultaneously operated as a current source.

While in exemplary embodiments a test procedure comprising the determination of one or a plurality of characteristic variables of the transformer can be implemented automatically, the transformer testing device and the method according to exemplary embodiments can also be used if only one characteristic variable of the transformer is measured before a new user input is required.

While the transformer can be installed in a power plant or substation of a power supply system, the transformer testing device and the method according to exemplary embodiments can also be used in the case of smaller transformers.

Different effects can be achieved with transformer testing devices, systems and methods according to exemplary embodiments. The time duration required for the test can be reduced. In particular, flexibility can be achieved without additional redistribution wirings. Transformers having a multiplicity of different configurations are used in practice. The properties of the transformers vary accordingly. Transformer testing devices, systems and methods according to the exemplary embodiments make it possible to test a great diversity of transformers having a multiplicity of different configurations. Transformer testing devices, systems and methods according to exemplary embodiments also allow the accuracy of the determination of characteristic variables to be increased by measurement currents and/or measurement voltages being correspondingly adapted. By way of example, test signals can be selectively increased in terms of their amplitude by means of the switching matrix.

Transformer testing device, methods and systems according to exemplary embodiments afford increased flexibility in the course of partly or completely automated transformer testing.

The invention claimed is:

1. A transformer testing device, comprising,
a housing,
a plurality of outputs provided in the housing for releasably connecting the transformer testing device to windings of a plurality of phases of a transformer and for impressing test signals on the plurality of phases of the transformer,
a plurality of test signal sources integrated in the housing, wherein each source of the plurality of test signal sources is configured in each case for generating a test signal, and
a switching matrix connected between the plurality of test signal sources and the plurality of outputs,
wherein the switching matrix is controllable to connect at least two test signal sources of the plurality of sources in series or in parallel such that at least one output of the plurality of outputs receives a test signal generated by the at least two test signal sources of the plurality of test signal sources being connected in series or in parallel,
wherein when the at least two test signal sources are operated as voltage sources, the test signal sources are connected by the switching matrix in series to generate a test signal having an increased voltage amplitude, and
wherein when the at least two test signal sources are operated as current sources, the test signal sources are connected in parallel by the switching matrix to generate a test signal having an increased current amplitude.

2. The transformer testing device as claimed in claim 1, further comprising a control unit for controlling the switching matrix, which is connected to at least one controllable switching means of the switching matrix.

3. The transformer testing device as claimed in claim 2, wherein the control unit is configured to drive the switching matrix such that, in a first state of the switching matrix, each of the plurality of outputs is conductively connected to respectively only one test signal source, and that, in a second state of the switching matrix, at least one output of the plurality of outputs is connected to at least two different test signal sources.

4. The transformer testing device as claimed in claim 2, wherein the control unit is configured to control the switching matrix depending on an input received at a user interface.

5. The transformer testing device as claimed in claim 4, wherein the user interface is configured to enable a selection between a simultaneous test of the plurality of phases of the transformer and a test of only one phase of the transformer.

6. The transformer testing device as claimed in claim 1, wherein each source of the plurality of test signal sources is configured to operate as a voltage source.

7. The transformer testing device as claimed in claim 1, wherein each source of the plurality of test signal sources is configured to operate as a current source.

8. The transformer testing device as claimed in claim 1, wherein each test signal source of the plurality of test signal sources is controllable such that it operates optionally as a voltage source or as a current source.

9. The transformer testing device as claimed in claim 1, wherein the transformer testing device comprises at least one controllable switch to short-circuit at least one of the phases of the transformer on a high-voltage side or on a low-voltage side.

10. The transformer testing device as claimed in claim 1, wherein the transformer testing device comprises at least three mutually different test signal sources.

11. A system comprising
a transformer having a plurality of phases, and
a transformer testing device as claimed in claim 1, which is releasably connected to the plurality of phases of the transformer by the outputs.

12. A method for testing a transformer having a plurality of phases with a transformer testing device having a plurality of outputs for releasably connecting the transformer testing device to the plurality of phases of the transformer, wherein the method comprises:
controlling a plurality of test signal sources of the transformer testing device in each case for generating a test signal, and
controlling a switching matrix of the transformer testing device to selectively connect at least one output of the plurality of outputs of the transformer testing device to a series connection or parallel connection of at least two test signal sources of the plurality of sources such that the at least one output of the plurality of outputs receives a test signal generated by the series connection or the parallel connection of the at least two test signal sources of the plurality of test signal sources,
wherein when the at least two test signal sources are operated as voltage sources, the test signal sources are connected by the switching matrix in series to generate a test signal having an increased voltage amplitude, and
wherein when the at least two test signal sources are operated as current sources, these test signal sources are connected in parallel by the switching matrix to generate a test signal having an increased current amplitude.

13. The method as claimed in claim 12, which is performed with the transformer testing device as claimed in claim 1.

* * * * *

UNITED STATES PATENT AND TRADEMARK OFFICE
CERTIFICATE OF CORRECTION

PATENT NO. : 10,914,778 B2
APPLICATION NO. : 15/543063
DATED : February 9, 2021
INVENTOR(S) : Dirk Flax et al.

It is certified that error appears in the above-identified patent and that said Letters Patent is hereby corrected as shown below:

On the Title Page

Item (87) should read:
PCT Pub. Date: Jul. 21, 2016

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*